United States Patent
Piazzon

(10) Patent No.: US 12,348,204 B2
(45) Date of Patent: Jul. 1, 2025

(54) DRIVER AMPLIFIER

(71) Applicant: Huawei Technologies Co., Ltd., Shenzhen (CN)

(72) Inventor: Luca Piazzon, Segrate (IT)

(73) Assignee: Huawei Technologies Co., Ltd., Shenzhen (CN)

( * ) Notice: Subject to any disclaimer, the term of this patent is extended or adjusted under 35 U.S.C. 154(b) by 602 days.

(21) Appl. No.: 17/716,829

(22) Filed: Apr. 8, 2022

(65) Prior Publication Data

US 2022/0231645 A1 Jul. 21, 2022

Related U.S. Application Data

(63) Continuation of application No. PCT/EP2019/077236, filed on Oct. 8, 2019.

(51) Int. Cl.
| | |
|---|---|
| H03F 3/45 | (2006.01) |
| H03F 1/32 | (2006.01) |
| H04B 10/58 | (2013.01) |
| H04B 10/54 | (2013.01) |

(52) U.S. Cl.
CPC ....... H03F 3/45475 (2013.01); H03F 1/3211 (2013.01); H04B 10/58 (2013.01); *H03F 2203/45702* (2013.01); *H04B 10/541* (2013.01); *H04B 2210/254* (2013.01)

(58) Field of Classification Search
CPC .................................................... H03F 3/45
USPC ............................................... 330/252, 257
See application file for complete search history.

(56) References Cited

U.S. PATENT DOCUMENTS

| | | | | |
|---|---|---|---|---|
| 5,442,318 | A | * | 8/1995 | Badyal ............... H03F 3/45192 330/253 |
| 5,812,297 | A | * | 9/1998 | Mussino ............... H04B 10/58 398/198 |
| 11,811,374 | B1 | * | 11/2023 | Hoffman .................. H03F 1/42 |
| 11,990,879 | B2 | * | 5/2024 | Halbert ............... H03F 3/45475 |
| 2008/0297258 | A1 | * | 12/2008 | Naito .................... H03G 1/007 327/552 |
| 2009/0243718 | A1 | * | 10/2009 | Bonthron ............... H03F 3/607 330/10 |
| 2016/0344355 | A1 | * | 11/2016 | Siniscalchi ......... H03F 3/45273 |
| 2018/0123524 | A1 | * | 5/2018 | Polesel ............... H03F 3/45183 |

OTHER PUBLICATIONS

Iscan et al., "Probabilistically Shaped Multi-Level Coding with Polar Codes for Fading Channels," Total 6 pages, Institute of Electrical and Electronics Engineers, New York, New York (2018).
Otaka et al., "A +10-dBm IIP3 SiGe Mixer With IM3 Cancellation Technique," IEEE Journal of Solid-State Circuits, vol. 39, No. 12, pp. 2333-2341, Institute of Electrical and Electronics Engineers, New York, New York (Dec. 2004).
Kim et al., "Linearization of Differential CMOS Low Noise Amplifier Using Cross-Coupled Post Distortion Canceller," 2008 IEEE Radio Frequency Integrated Circuits Symposium, p. 83-86 (2008).

* cited by examiner

*Primary Examiner* — Henry Choe
(74) *Attorney, Agent, or Firm* — Leydig, Voit & Mayer, Ltd.

(57) ABSTRACT

A driver amplifier circuit includes a non-linear differential amplifier and a non-linear resistor connected across output terminals of the differential amplifier. The non-linear resistor has a resistance value that increases as an amplitude of a differential voltage across the non-linear resistor increases.

16 Claims, 9 Drawing Sheets

DRIVER AMPLIFIER

CROSS-REFERENCE TO RELATED APPLICATIONS

This application is a continuation of International Application No. PCT/EP2019/077236, filed on Oct. 8, 2019, the disclosure of which is hereby incorporated by reference in its entirety.

FIELD

Embodiments described in the present application relate to driver amplifier circuits, including a driver amplifier circuit for high speed optical communications systems.

BACKGROUND

In transmitters for optical communications, a differential driver amplifier is used to increase the signal level generated from a high-speed digital signal source in order to properly drive an electro-optical modulator.

To increase data-rates of optical transmitters, quadrature amplitude modulation (QAM) schemes have been recently introduced in optical communications resulting in much more stringent requirements for total harmonic distortion (THD) of driver amplifier.

Accordingly, any solution that allows a driver amplifier to be provided with an improved THD is of interest.

SUMMARY

In a first aspect, a driver amplifier circuit is provided. The driver amplifier circuit includes a non-linear differential amplifier and a non-linear resistor connected across output terminals of the differential amplifier. The non-linear resistor has a resistance value that increases as the differential voltage amplitude across the non-linear resistor increases.

The non-linear resistor counteracts the non-linearity of the differential amplifier by having a resistance that increases with voltage. As the output current of the driver amplifier circuit will be the difference between the current output of the differential amplifier and the current through the non-linear resistor, the non-linearity in the output current may be reduced or eliminated thereby reducing the total harmonic distortion (THD) of the driver amplifier circuit.

In addition, such a circuit may be constructed so as to have a low parasitic capacitance and therefore a wide bandwidth. Also, the addition of the non-linear resistor does not necessitate any additional biasing and thus the THD in the circuit can be reduced without requiring additional power consumption.

In an implementation of the first aspect, the non-linear resistor is configured to absorb a current that depends on voltage according to a hyperbolic tangent function. Accordingly, for small voltage levels the current will grow linearly but for higher voltages the current will saturate, thus generating higher order harmonics which will cancel corresponding harmonic content in the differential amplifier signal.

In an implementation of the first aspect, the non-linear resistor is configured so that the current flowing across the non-linear resistor is subtracted from the output current of the non-linear differential amplifier to provide a current at the output of the driver amplifier circuit that is substantially linear with respect to an input voltage provided at inputs of the non-linear differential amplifier. The subtraction provides the cancellation of the harmonics and providing a linear signal response for the driver amplifier circuit.

In an implementation of the first aspect, the non-linear resistor comprises at least a first transistor configured to operate as a two-terminal device. A transistor such as a field effect transistor (FET) provides a simple and readily available component to provide the non-linearity of the non-linear resistor. For example, where the transistor is a FET (e.g. a metal-oxide-semiconductor field-effect transistor, or MOSFET), the gate may be connected to the source or the drain thereby permitting the FET to operate passively (i.e. not requiring separate biasing) as a non-linear resistive element. The non-linear resistor may include second transistor configured as a two-terminal device that is connected in series with the first transistor. In an implementation, the first and second transistors are field effect transistors. The gate of the first transistor may be coupled to a gate terminal of the second transistor. This is advantageous because the gate of the respective transistors does then not need to be connected to the output terminals (rails) of the amplifier and the parasitic capacitance associated with the gate can be eliminated or reduced.

In an implementation of the first aspect, the drain terminal of the first transistor is coupled to a positive output terminal of the differential amplifier, the drain terminal of the second resistor is coupled to a negative output terminal of the differential amplifier, and the source terminal of the first and second transistors is coupled to the gate terminals of the first and second transistors. In another implementation, the source terminal of the first transistor is coupled to a positive output terminal of the differential amplifier, the source terminal of the second resistor is coupled to a negative output terminal of the differential amplifier, and the drain terminal of the first and second transistors is coupled to the gate terminals of the first and second transistors. In another implementation, the drain terminal of the first transistor is coupled to a positive output terminal of the differential amplifier, the source of the second resistor is coupled to a negative output terminal of the differential amplifier, and the drain terminal of the first transistor and the source terminal of the second transistor are coupled with the gate terminals of the first and second transistors.

In an implementation of the first aspect, the driver amplifier circuit further comprises a linear resistor connected between the non-linear resistor and the positive and/or negative output terminals of the differential amplifier. By including a resistor between the transistor terminal and the output terminal(s) (e.g. rail(s)) of the differential amplifier, the circuit can be made resistant to damaging high currents caused by unexpected electrostatic discharge, for example, when the circuit is being installed or inspected.

In a second aspect, there is provided a transmitter comprising a driver amplifier circuit according to any implementation of the first aspect. In an implementation of the second aspect, the transmitter may comprise an electro-optical modulator configured to modulate an optical signal according to the output of the driver amplifier circuit. Accordingly, a modulated optical signal with low THD may be provided using a power efficient and high bandwidth driver. In an example, the transmitter is an optical module or another optical networking device.

In an implementation of the second aspect, the transmitter may comprise a signal source configured to provide a signal to the driver amplifier circuit. The signal source may be configured to provide a signal modulated according to a quadrature amplitude modulation scheme. For example, in an implementation, the signal source may comprise a digital-to-analogue converter. Thus, data for transmission can be provided as an analogue signal which may be effectively amplified by the driver amplifier circuit.

BRIEF DESCRIPTION OF THE DRAWINGS

Embodiments will now be described, by way of example only, with reference to the accompanying drawings, in which.

DETAILED DESCRIPTION

Figure 1:
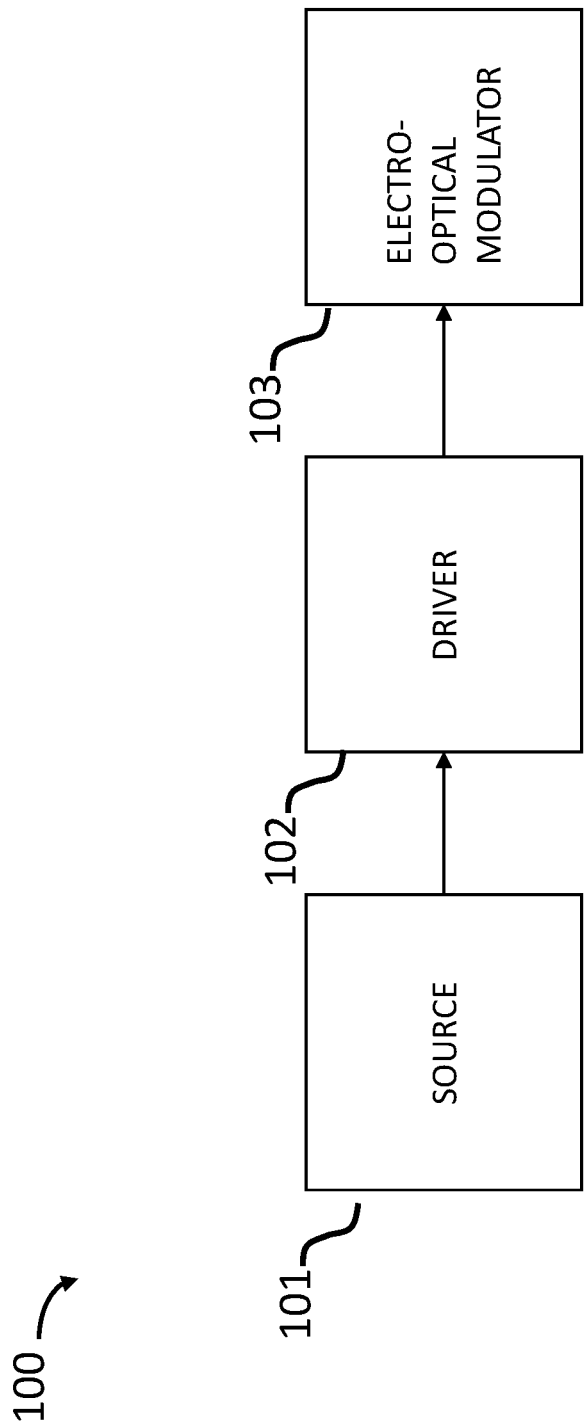
FIG. 1 shows a block diagram showing components of a transmitter for a communications system.

Example embodiments are described below in sufficient detail to enable those of ordinary skill in the art to embody and implement the systems and processes herein described. It is important to understand that embodiments can be provided in many alternate forms and should not be construed as limited to the examples set forth herein.

Accordingly, while embodiments can be modified in various ways and take on various alternative forms, exemplary embodiments thereof are shown in the drawings and described in detail below as examples. There is no intent to limit to the particular forms disclosed. On the contrary, all modifications, equivalents, and alternatives falling within the scope of the appended claims should be included. Elements of the example embodiments are consistently denoted by the same reference numerals throughout the drawings and detailed description where appropriate.

The terminology used herein to describe embodiments is not intended to limit the scope. The articles "a," "an," and "the" are singular in that they have a single referent, however the use of the singular form in the present document should not preclude the presence of more than one referent. In other words, elements referred to in the singular can number one or more, unless the context clearly indicates otherwise. It will be further understood that the terms "comprises," "comprising," "includes," and/or "including," when used herein, specify the presence of stated features, items, steps, operations, elements, and/or components, but do not preclude the presence or addition of one or more other features, items, steps, operations, elements, components, and/or groups thereof.

Unless otherwise defined, all terms (including technical and scientific terms) used herein are to be interpreted as is customary in the art. It will be further understood that terms in common usage should also be interpreted as is customary in the relevant art and not in an idealized or overly formal sense unless expressly so defined herein.

An optical transmitter system 100 is shown in FIG. 1 which includes a signal source 101, a driver amplifier 102 and an electro-optical modulator 103. The source 101 may include a digital-to-analogue converter (DAC). This may be configured to receive digital signal comprising a binary data stream and encode the binary data stream as symbols in an analogue signal according to an existing modulation scheme. For example, a quadrature phase shift keying (QPSK e.g. 8-PSK) or quadrature amplitude modulation (QAM, e.g. 16-QAM, 32-QAM or 64-QAM) scheme may be used to generate the analogue signals from high speed digital signal source. Even simpler schemes such as return-to-zero (RZ) or non-return-to-zero (NRZ) and on/off keying (OOK) may alternatively or additionally be used. The scheme chosen may depend on the spectral efficiency and the complexity of the source providing the signal for modulation by the electro-optical modulator 103.

The driver amplifier 102 is an electrical signal amplifier which is configured to receive analogue electrical signals from the signal source 101 and amplify them to a level that is suitable for causing modulation at the electro-optical modulator 103. A typical driver amplifier will be a differential amplifier with differential inputs and outputs (i.e. a fully differential amplifier).

The electro-optical modulator 103 uses the electro-optical effect to modulate the phase of light travelling through the modulator. For example, light may travel through a crystal (e.g. lithium niobate) having a refractive index which depends on the strength of the local electric field. The local electric field may be modulated by the signal output by the driver 102 to modulate the light. In an embodiment, the electro-optical modulator 103 may include one or more Mach-Zehnder electro-optical modulators for suitably modulating the I and Q components, for example, for transmission of a QPSK or QAM signal. Other types and topologies, technologies and materials of electro-optical modulator are possible as will be appreciated by those skilled in the art.

The transmitter may be embodied, for example, in any optical communications device in an optical network. One example of an optical communications device is an optical module. An optical module is a hot-pluggable transmitter (or transceiver) used in high bandwidth data communications applications (e.g. greater than 10 Gbit/s).

Figure 2:
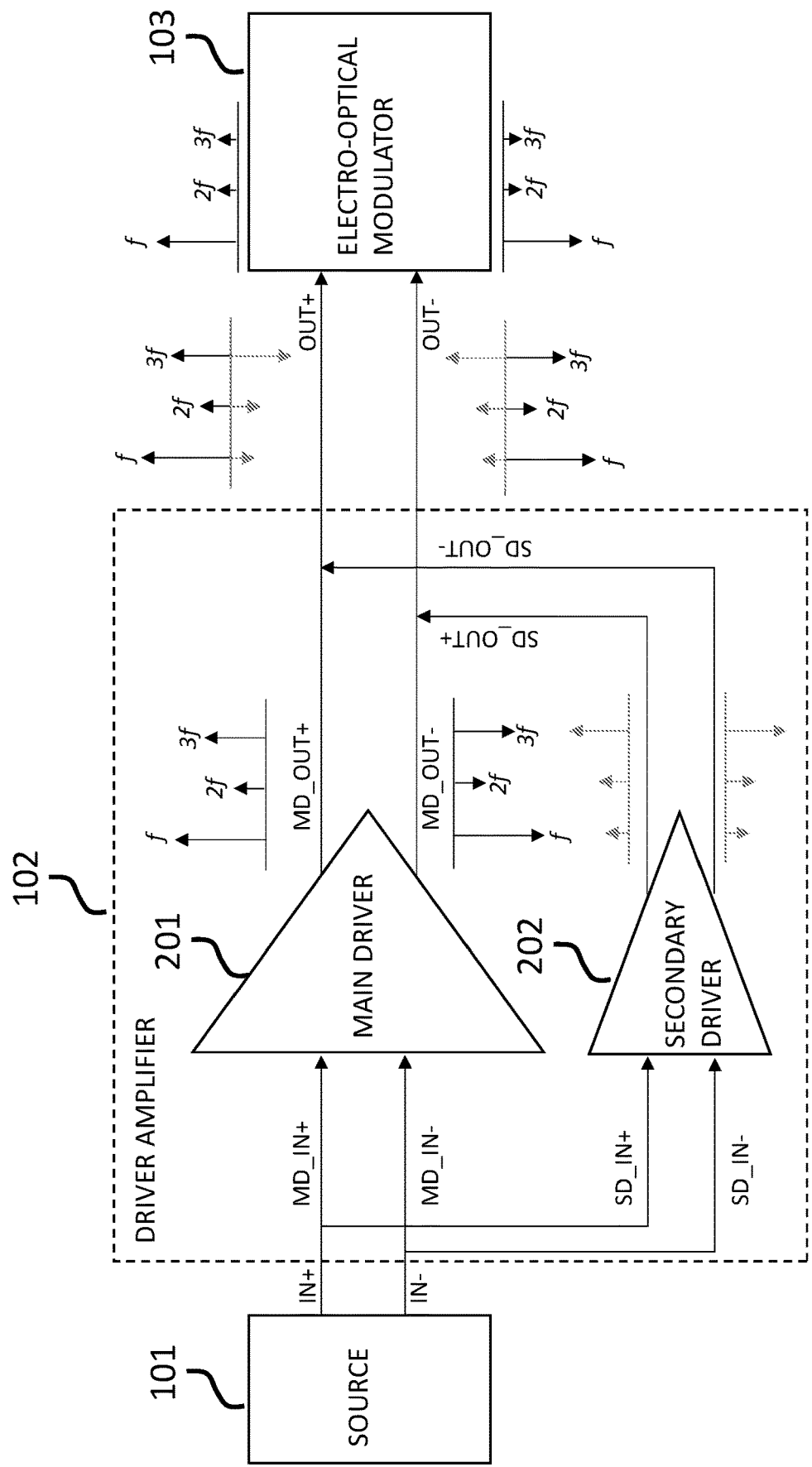
FIG. 2 shows a block diagram showing components of a transmitter according to a communications system.

A scheme adopted to reduce the THD of a driver amplifier 102 is shown in FIG. 2. The driver amplifier 102 has differential input terminals (IN+ and IN−) connected to the outputs of the source 101 and differential output terminals (OUT+ and OUT−) connected to the electro-optical modulator 103. The driver amplifier 102 is composed of two circuit elements, a main driver 201 and a secondary driver 202. A differential input signal from the source 101 is split between differential inputs (MD_IN+ and MD_IN−) of the main driver 201 and differential inputs (SD_IN+ and SD_IN−) of the secondary driver 202.

The differential outputs of the main driver (MD_OUT+ and MD_OUT−) and of the secondary driver (SD_OUT+ and SD_OUT−) are connected in opposite phase, i.e. the positive output terminal of the main driver MD_OUT+ is connected to the negative output terminal of the secondary driver SD_OUT− and the negative output terminal of the main driver MD_OUT− is connected to the positive output terminal of the secondary driver SD_OUT+. The main driver 201 is designed to linearly amplify the input signal at the operating frequency 'f'. However, due to the THD of the main driver 201, it will also produce its higher order harmonics ('2f, 3f, . . . '), that have generally a lower amplitude with respect to the operating frequency 'f'.

The secondary driver 202 is designed to behave as strongly nonlinear. As a consequence, for a small amplitude of operating frequency component 'f', higher amplitude signal components for higher order harmonics ('2f, 3f, . . . ') are generated. Since the outputs MD_OUT+, MD_OUT− of the main driver 201 and SD_OUT+, SD_OUT− of the secondary driver are connected in opposite phase, the result is that both the components at the operating frequency 'f' and the higher order harmonic components ('2f, 3f, . . . ') of the signal output from the secondary driver 202 are subtracted from the signals output by the main driver 201. As the amplitude of 'f of the main driver is much higher than the amplitude of 'f' of the signal output by the secondary driver, the final amplitude of the operating frequency component 'f that reaches the electro-optical modulator is only slightly smaller than the signal component at frequency 'f' generated by the main driver 201. At the same time, given the amplitudes of the higher order harmonics ('2f, 3f, . . . ') outputted from the main driver are similar to the amplitudes of the higher order harmonics ('2f, 3f, . . . ') outputted from the secondary driver, the final amplitudes of the higher order harmonics ('2f, 3f, . . . ') that reach the electro-optical modulator is close to zero. The result is that the THD level of the signals that are provided to the input of the electro-optical modulator are very low.

There are a number of disadvantages with this approach, however. These include:
1) Higher power consumption: the secondary driver 202 requires biasing and, thus, consumes DC power thereby increasing the overall power consumption of the driver amplifier circuitry 102;
2) Reduced bandwidth: the inclusion of a secondary driver 202 increases the input and output parasitic capacitances of the driver, thus reducing the maximum operating frequency of the driver amplifier circuitry 102. This can make it unsuitable for high data rate applications.

The scheme described in FIG. 2 may improve the THD, but at a cost of higher power consumption and reduced operating bandwidth.

Figure 3:
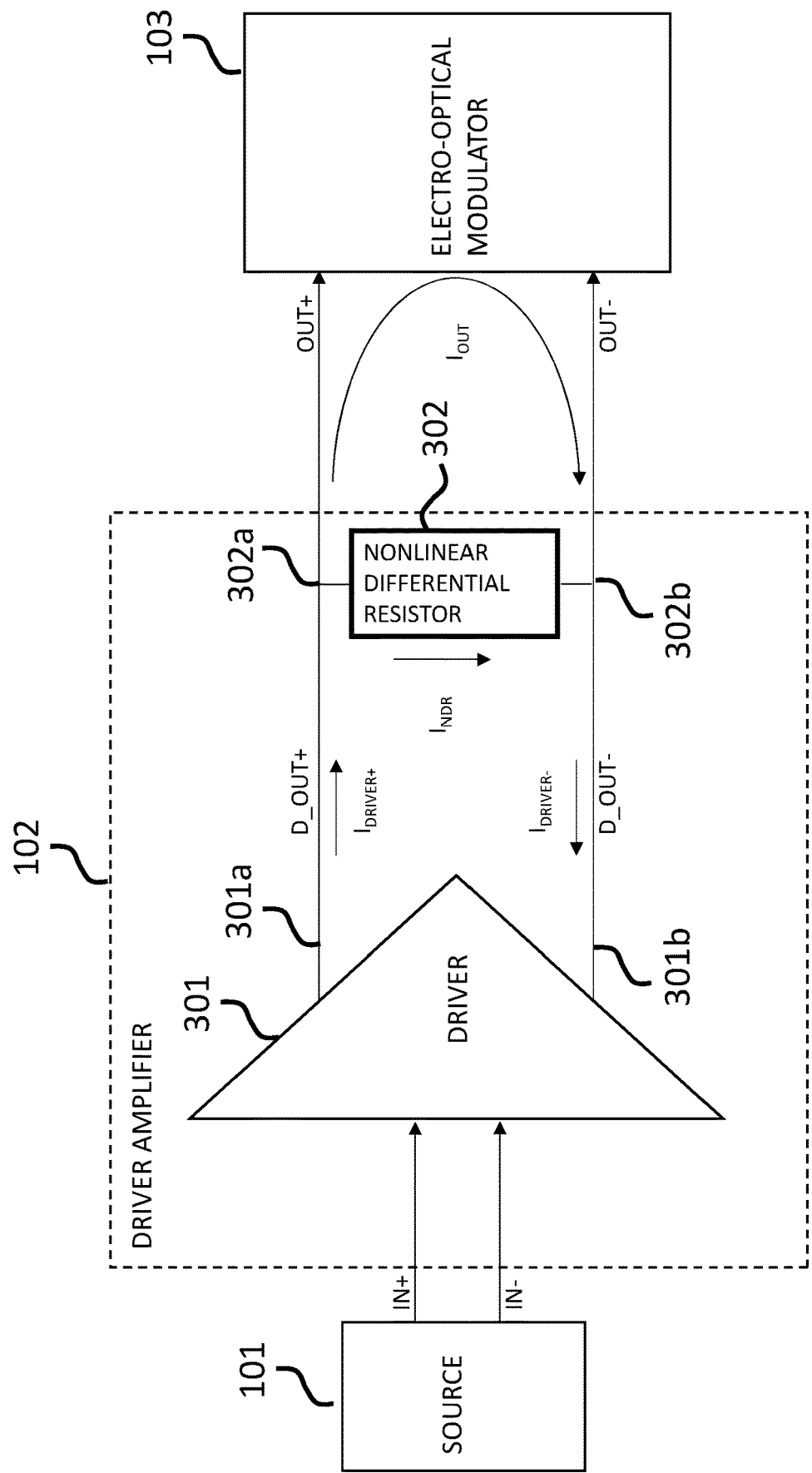
FIG. 3 shows a schematic block diagram showing components of a transmitter according to an embodiment of the present application.

An embodiment is shown in FIG. 3, whereby a driver amplifier 102 is shown which uses a non-linear differential resistor (NDR) 302 to effectively linearize the output of the driver amplifier and provide an output signal to the electro-optical modulator 103 with low THD.

For example, as shown in FIG. 3, the driver amplifier has a single differential amplifier as a driver 301. A differential input signal is provided by the source 101 at inputs IN+ and IN− of the driver 301 which provides a differential output at positive and negative output rails (terminals) 301a and 301b respectively. In other words, the driver 301 may be a fully differential amplifier according to embodiments. A nonlinear differential resistor (NDR) is added at the output of the driver 301 between the output terminals i.e. across the output rails 301a, 301b of the driver 301. The differential signal (OUT+, OUT−) across the NDR is provided at the output of the driver amplifier 102 to the electro-optical modulator 103. As shown a driver current $I_{DRIVER}$ flows between the terminals of the driver 301. A portion of that driver current $I_{DRIVER}$ will pass through the NDR as $I_{NDR}$ and the remainder will be the output current IOUT which flows through the electro-optical modulator as the differential signal outputs. The main behavior or characteristic of the nonlinear differential resistor is that the resistance of the NDR increases with increasing voltage dropped across its terminals 302a, 302b.

Figure 4C:
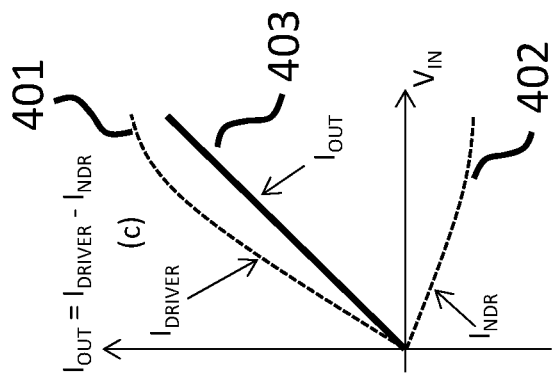
FIGS. 4a, 4b and 4c show current-voltage plots corresponding to a differential amplifier, a non-linear differential resistor (NDR) and at an output from a driver circuit respectively, according to an embodiment of the present application.
Figure 4B:
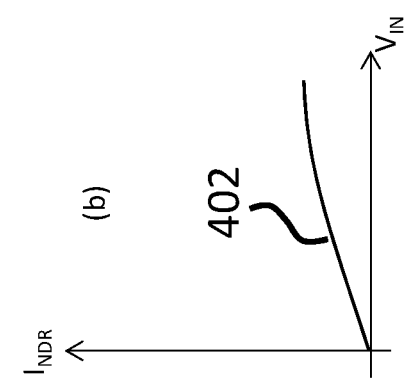
Figure 4A:
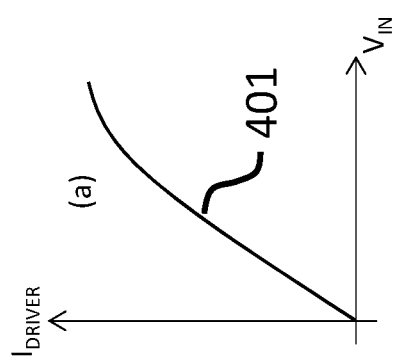

The functional behavior of the circuit of FIG. 3 can be explained by reference to the current-voltage characteristics shown in FIGS. 4 (a), (b) and (c). The differential output current of the driver ($I_{DRIVER}$) has a behavior 401 shown in FIG. 4 (a), where the horizontal axis represents the differential input voltage ($V_{IN}=V_{IN+}-V_{IN-}$) and the vertical axis the current $I_{DRIVER}$. The current $I_{DRIVER}$ grows substantially linearly with respect $V_{IN}$ for small amplitude levels of $V_{IN}$, then $I_{DRIVER}$ begins to saturate at higher amplitude levels because higher order harmonics are generated. The current flowing across the nonlinear differential resistor NDR ($I_{NDR}$) has the behavior 402 shown in FIG. 4 (b). As for the driver current $I_{DRIVER}$, the current $I_{NDR}$ also grows substantially linearly with respect to the input voltage $V_{IN}$ across its terminals for small amplitude levels of $V_{IN}$, then it saturates because higher order harmonics are generated. The final differential output current that reaches the electro-optical modulator (IOUT) is the difference between $I_{DRIVER}$ and $I_{NDR}$, resulting in the current-voltage characteristic 403 shown in FIG. 4 (c). As shown, the output current IOUT is substantially linear with respect to input voltage $V_{IN}$, resulting in a very low level of THD. In other words, by having an NDR 302 connected across the output terminals of the driver (differential amplifier) 301, the current flowing across the NDR 302 $I_{NDR}$ is subtracted from the output current at the differential amplifier 301 to provide a current output of the driver amplifier circuit 102 that is substantially linear with respect to input voltage $V_{in}$.

By designing the NDR 302 response appropriately, therefore, the non-linearity in the driver output current may be negated and the output of the driver amplifier 102 linearized to provide a very low THD. The current-voltage characteristic of the NDR 302 may be considered as a hyperbolic tangent function according to embodiments. By selecting or designing appropriate circuitry to approximate or replicate this behavior the desirable cancellation of the harmonic distortion present in the driver 301 can be achieved. Moreover, using such a nonlinear differential resistor does not require bias current and voltage, as a consequence the overall power consumption is not increased. Further, the input/output parasitic capacitances of the non-linear differential resistor circuitry 302 may be designed to be much lower than a driver such as a differential amplifier, as a consequence the bandwidth of the driver amplifier circuit 102 is not negatively affected. Accordingly, the use of an NDR 302 allows driver amplifier circuits 102 with very low THD level to be provided without increasing power consumption and/or reducing operating bandwidth.

Various embodiments will now be described which show electronic circuit elements or combinations of circuit elements which would provide the desired NDR 302 behaviour. The present application is not limited to these embodiments, however, and it is envisaged other circuitry may be used which provides the behaviour of resistance increasing with voltage e.g. according to a hyperbolic tangent function, or other function which provides a characteristic that negates at least a portion of the THD of the driver 301.

Figure 5:
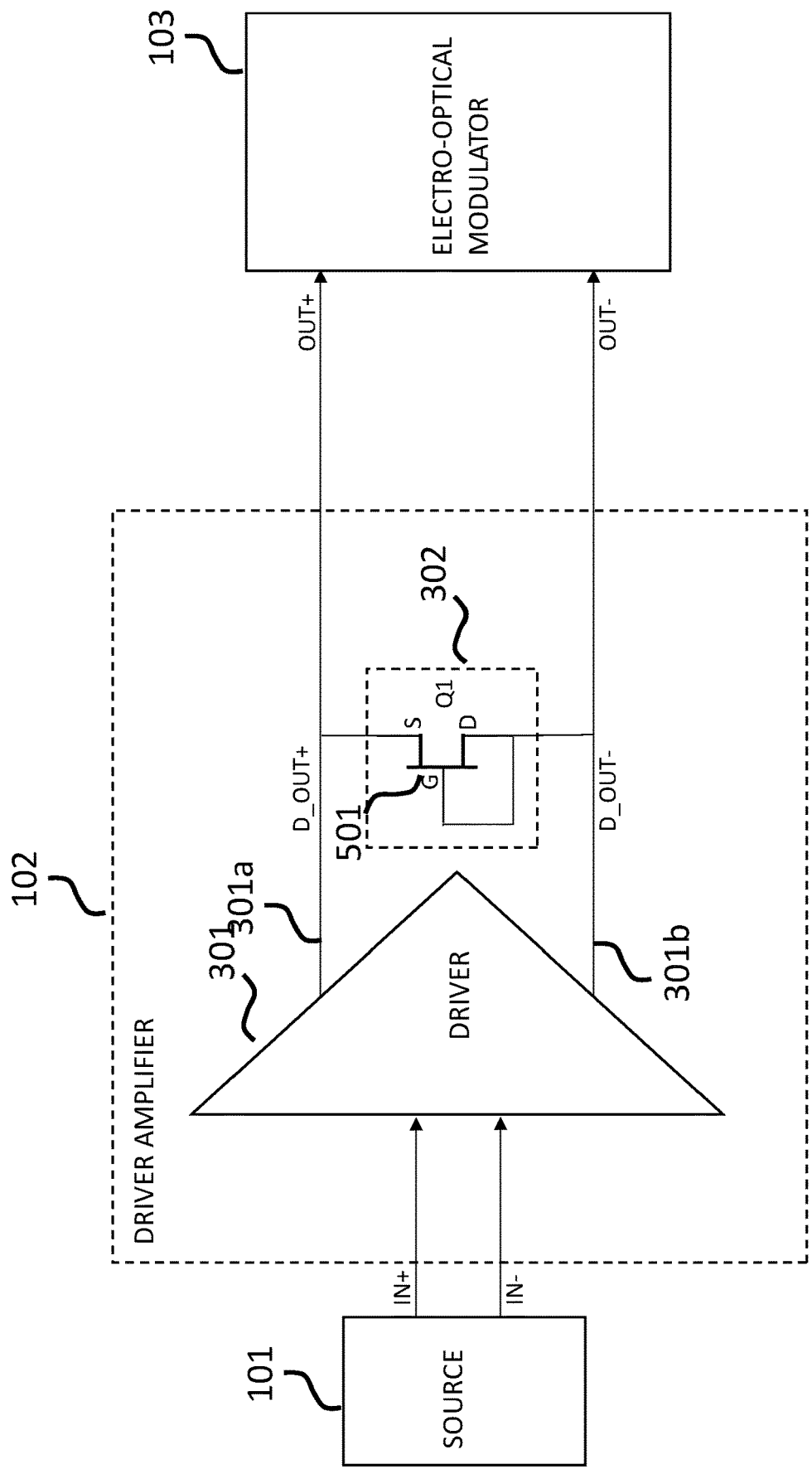
FIG. 5 shows a block diagram of a transmitter according to an embodiment of the present application in which the NDR consists of a field effect transistor.

FIG. 5 shows an embodiment of the driver amplifier circuit 102 in which the NDR is implemented using a field effect transistor (FET) 501. The gate and the drain of the FET are coupled together such that the FET operates as a two-terminal resistive device. The non-linearity of the FET response when configured as a resistor in this manner may provide the desired NDR characteristic. The coupled gate (G) and drain (D) terminals are connected to the negative differential output rail 303b, while the source(S) is connected to the positive output rail 303a.

As the transistor behaves symmetrically when configured as a two-terminal device the FET 501 could, according to a further embodiment, be reversed in polarity such that the gate (G) and drain (D) were connected to the positive rail 303a and the source(S) connected to the negative rail 303b.

A consequence of using the single FET 501 configured in this manner to provide the NDR 302, is that the gate capacitance of the FET 501 is parasitic to the driver circuit 102 because it is connected to an output rail of the driver 301, thus potentially reducing the operating bandwidth.

Figure 6:
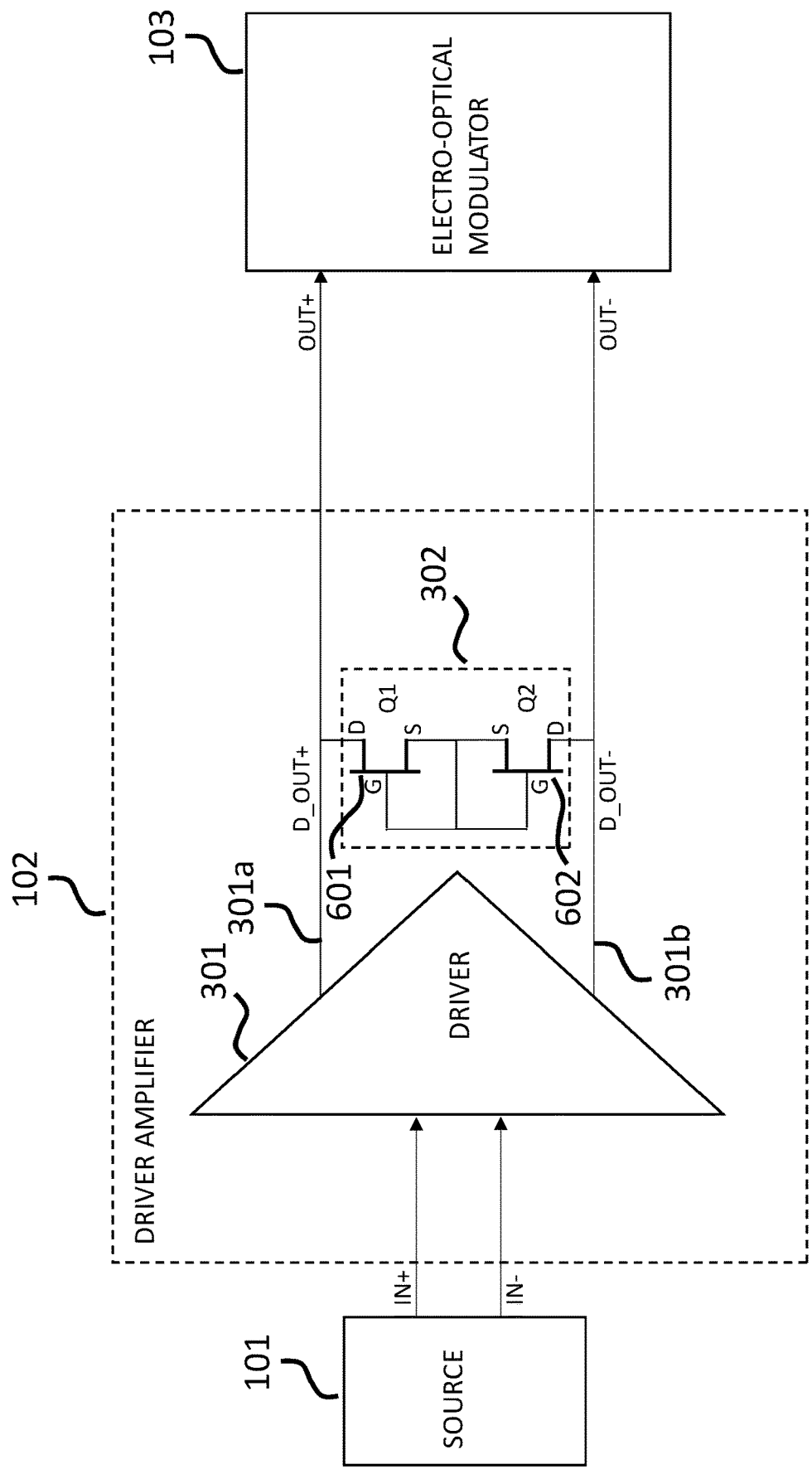
FIG. 6 shows a block diagram of a transmitter according to an embodiment of the present application in which the NDR consists of a pair of field effect transistors connected in series.

FIG. 6 shows an embodiment in which the nonlinear differential resistor NDR is implemented by means of two back to back first and second FET transistors 601, 602 (Q1 and Q2) connected in series. The drain (D) of the first FET 601 is connected to the positive rail 301a (D_OUT+) and the drain (D) of the second FET 602 being connected to the negative rail 301b (D_OUT−). The gate (G) and source(S) terminals of the first and second FETs 601, 602 are connected together. Thus, both the first and second FETs act as two terminal devices and because they are in series act as a single non-linear resistor. This two-transistor embodiment is advantageous over the FIG. 5 embodiment, for example, because the gate terminals of the neither FET 601 or FET 602 are connected to output terminals of the driver 301, thus avoiding introducing parasitic capacitances which may reduce operating bandwidth.

Figure 7:
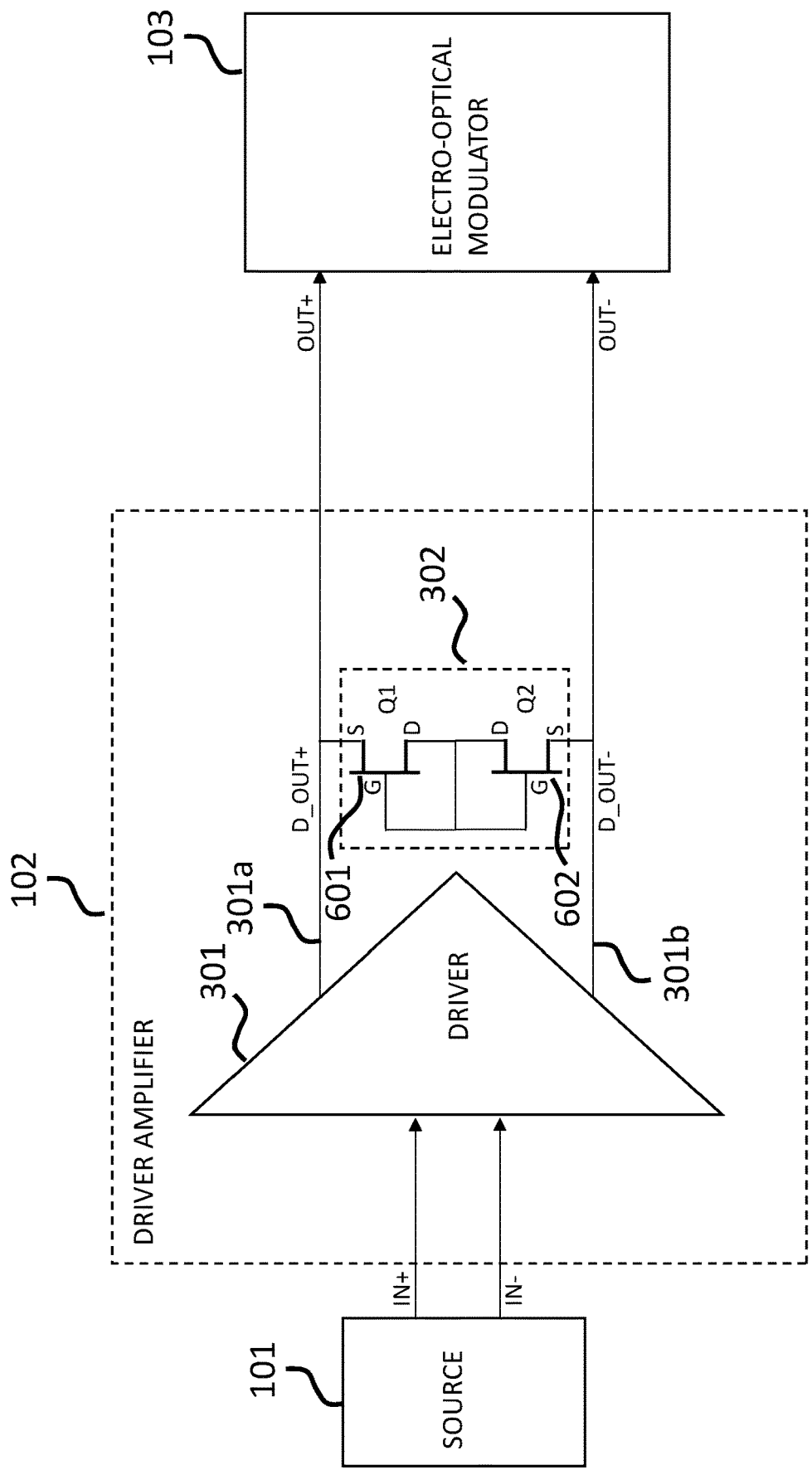
FIG. 7 shows a block diagram of a transmitter according to an embodiment of the present application where the NDR consists of a pair of field effect transistors connected in series.

An alternative embodiment is shown FIG. 7, where the drain (D) and source(S) terminals of both first and second FETs 601, 602 (Q1 and Q2) implementing the nonlinear resistor are inverted such that the source(S) terminal of the first FET 601 (Q1) is connected to the positive driver rail 301a (D_OUT+) and the source(S) terminal of the second FET 602 (Q2) is connected to the negative driver rail 301b (D_OUT−). The gate (G) and drain (D) of the first and second FETs 601, 602 are connected together. This is possible, for example, where the polarity of the FET in two-terminal configuration is not important due to symmetrical electrical characteristics.

Figure 8:
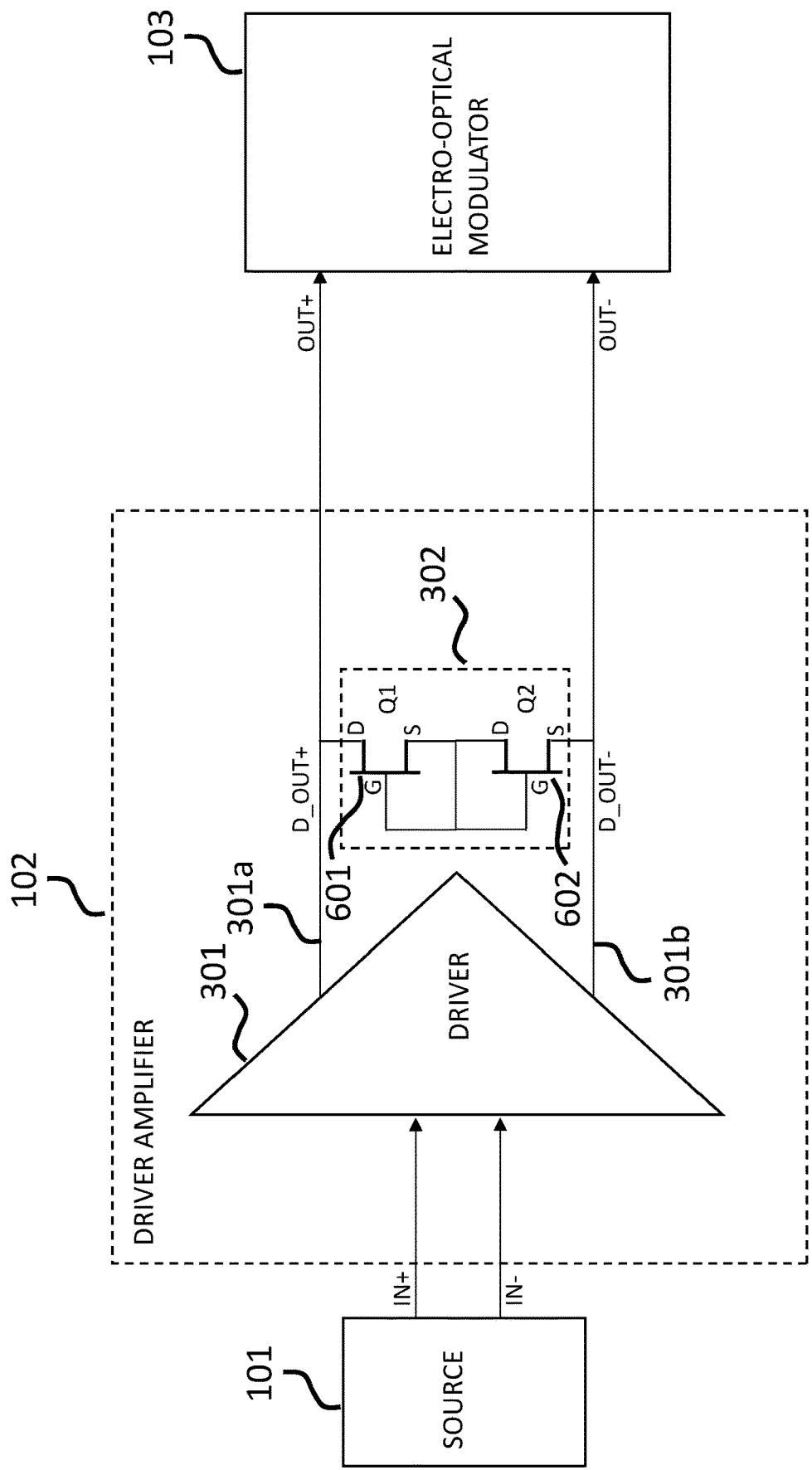
FIG. 8 shows a block diagram of a transmitter according to an embodiment of the present application where the NDR consists of a pair of field effect transistors connected in series.

An alternative embodiment is shown in FIG. 8, where the FETs 601 and 602 have the same polarity such that the drain (D) of the first FET 601 (Q1) is connected to the positive rail 301a (D_OUT+) and the source(S) of the second FET 602 (Q2) is connected to the negative rail 301b (D_OUT−). The gates (G) of the first and second FETs 601, 602 are connected with the source of the first FET 601 (Q1) and the drain (D) of the second FET 602 (Q2) In this embodiment the terminals of the second FET 602 (Q2) are inverted when compared to the embodiment shown in FIG. 6, but according to another embodiment, the same result can be achieved if the terminals of the first FET 601 (Q1) are inverted while the terminals of Q2 are left as they are with respect to the FIG. 6 embodiment.

Figure 9:
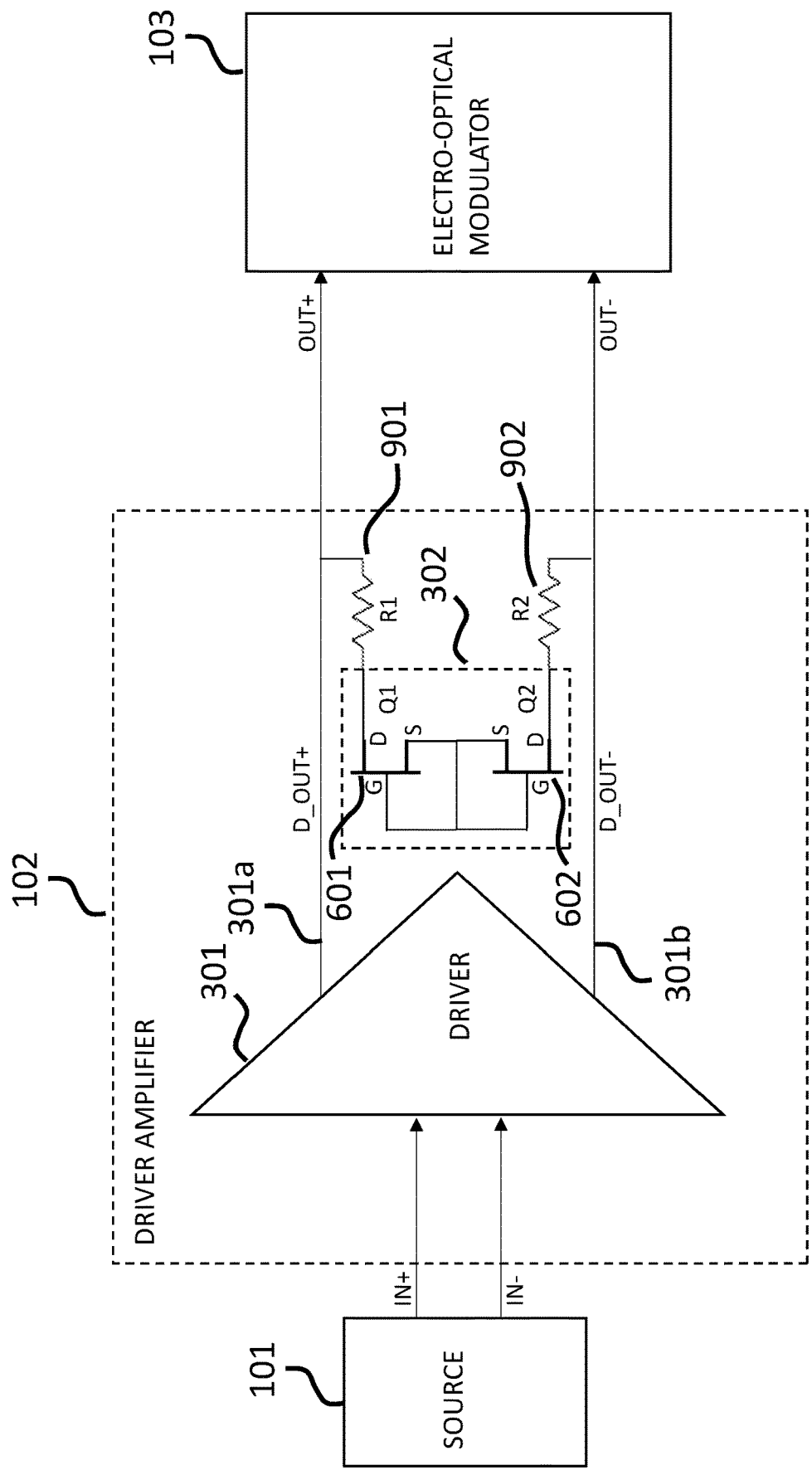
FIG. 9 shows a block diagram of a transmitter according to an embodiment of the present application where the NDR consists of a pair of field effect transistors connected in series where the field effect transistors are coupled to output rails of a differential amplifier via respective resistors.

A further embodiment is shown in FIG. 9, which is similar to the embodiment of FIG. 6, however, two resistors 901, 902 (R1 and R2) are inserted between the connection terminals 302a, 302b of the NDR and the respective output rails 301a, 301b of the driver 301. The resistors can be of the same value or different value. The resistors 901, 902 (R1 and R2) act to effectively fix the amount of current flowing through the circuit and thus protect the circuit elements (e.g. the FETs 601, 602) from damage due to electrostatic discharge. Such discharge may occur, for example, when the driver amplifier circuit is being mounted or measured due to electrostatic discharge from a measurement or installation instrument. The resistance value of the NDR may be low which means that a high and damaging current may flow through the circuit in the case of such an electrostatic discharge. The linearity of the resistor(s) 901, 902 may reduce the THD cancellation benefit because it reduces the non-linearity of the NDR to some extent, but by careful choice of resistor 901, 902 values this can be managed so that a substantial benefit in THD reduction is gained while still protecting the circuit 102 from electrostatic discharge. Although the NDR 302 in FIG. 9 is shown as the two FET 601, 602 configuration according to the embodiment of FIG. 6, it will be appreciated that the protection resistors 901, 902 (R1 and R2) may be used with other implementations of the NDR e.g. the single transistor implantation of FIG. 5.

In the above embodiments, the NDR is comprised of one or more FETs such as n-type or p-type MOSFETs. However, as will be appreciated, other transistor elements could be used instead. For example, bipolar junction transistors could be used or junction field effect transistors provided the increasing resistance with voltage behaviour could be provided i.e. by configuring the transistor (or other circuit element) as a non-linear two terminal device.

A person of ordinary skill in the art may be aware that, in combination with the examples described in the embodiments disclosed in this specification, units and algorithm steps may be implemented by electronic hardware, or a combination of computer software and electronic hardware. Whether the functions are performed by hardware or software depends on particular applications and design constraint conditions of the technical solutions. A person skilled in the art may use different methods to implement the described functions for each particular application, but it should not be considered that such implementation goes beyond the scope of the present application.

It may be clearly understood by a person skilled in the art that, for the purpose of convenient and brief description, for a detailed working process of the foregoing system, apparatus, and unit, reference may be made to the corresponding process in the foregoing method embodiments, and details are not described herein again.

In the embodiments provided in the present application, it should be understood that the disclosed system, apparatus, and method may be implemented in other manners. For example, the described apparatus embodiment is merely exemplary. For example, the unit division is merely logical function division and may be other division in actual implementation. For example, a plurality of units or components may be combined or integrated into another system, or some features may be ignored or not performed. In addition, the displayed or discussed mutual couplings or direct couplings or communications connections may be implemented through some interfaces. The indirect couplings or communications connections between the apparatuses or units may be implemented in electronic, mechanical, or other forms.

The units described as separate parts may or may not be physically separate, and parts displayed as units may or may not be physical units, may be located in one position, or may be distributed on a plurality of network units. A part or all of the units may be selected according to actual needs to achieve the objectives of the solutions of the embodiments.

In addition, functional units in the embodiments of the present application may be integrated into one processing unit, or each of the units may exist alone physically, or two or more units are integrated into one unit.

When the functions are implemented in the form of a software functional unit and sold or used as an independent product, the functions may be stored in a computer-readable storage medium. Based on such an understanding, technical solutions of the present application may be implemented in the form of a software product. The computer software product is stored in a storage medium, and includes several instructions for instructing a computer device (which may be a personal computer, a server, or a network device) to perform all or a part of the steps of the methods described in the embodiments of the present application. The foregoing storage medium includes: any medium that can store program codes, such as a USB flash drive, a removable hard disk, a read-only memory (ROM, Read-Only Memory), a random access memory (RAM, Random Access Memory), a magnetic disk, or an optical disc.

The present application can be embodied in other apparatus and/or methods. The described embodiments are to be considered in all respects as illustrative and not restrictive. In particular, the scope of the present application is indicated by the appended claims rather than by the description and figures herein. All changes that come within the meaning and range of equivalency of the claims are to be embraced within their scope.

What is claimed is:

1. A driver amplifier circuit comprising:
a non-linear differential amplifier; and
a non-linear resistor connected across output terminals of the differential amplifier,
wherein the non-linear resistor has a resistance value that increases as an amplitude of a differential voltage across the non-linear resistor increases, and
wherein the non-linear resistor is configured to absorb a current that depends on the differential voltage according to a hyperbolic tangent function.

2. The circuit according to claim 1, wherein the non-linear resistor is configured so that a current flowing across the non-linear resistor is subtracted from an output current of the non-linear differential amplifier to provide an output current of the driver amplifier circuit that is substantially linear with respect to an input voltage provided at inputs of the non-linear differential amplifier.

3. The circuit according to claim 1, wherein the non-linear resistor comprises at least a first transistor configured to operate as a first two-terminal device.

4. The circuit according to claim 3, wherein the non-linear resistor further comprises a second transistor configured as a second two-terminal device that is connected in series with the first transistor.

5. The circuit according to claim 4, wherein the first transistor and the second transistor are field effect transistors (FETs).

6. The circuit according to claim 5, wherein a gate terminal of the first transistor is coupled to a gate terminal of the second transistor.

7. The circuit according to claim 6, wherein a drain terminal of the first transistor is coupled to a positive output terminal of the differential amplifier;
a drain terminal of the second resistor is coupled to a negative output terminal of the differential amplifier; and
a source terminal of the first transistor and a source terminal of the second transistor are coupled to the gate terminal of the first transistor and the gate terminal of the second transistor.

8. The circuit according to claim 6, wherein a source terminal of the first transistor is coupled to a positive output terminal of the differential amplifier;
a source terminal of the second resistor is coupled to a negative output terminal of the differential amplifier; and
a drain terminal of the first transistor and a drain terminal of the second transistor are coupled to the gate terminal of the first transistor and the gate terminal of the second transistor .

9. The circuit according to claim 6, wherein a drain terminal of the first transistor is coupled to a positive output terminal of the differential amplifier;
a source terminal of the second resistor is coupled to a negative output terminal of the differential amplifier; and
a source terminal of the first transistor and a drain terminal of the second transistor are coupled with the gate terminal of the first transistor and the gate terminal of the second transistor.

10. The circuit according to claim 6, further comprising a first linear resistor connected in series between the non-linear resistor and a positive output terminal of the differential amplifier.

11. A transmitter comprising the driver amplifier circuit according to claim 1.

12. The transmitter according to claim 11, further comprising an electro-optical modulator configured to modulate output of the driver amplifier circuit.

13. The transmitter according to claim 11, further comprising a signal source configured to provide a signal to the driver amplifier circuit.

14. The transmitter according to claim 13, wherein the signal source is configured to provide the signal that is modulated according to a quadrature amplitude modulation scheme.

15. The transmitter according to claim 13, wherein the signal source comprises a digital-to-analogue converter.

16. The circuit according to claim 10, further comprising a second linear resistor connected in series between the non-linear resistor and a negative output terminal of the differential amplifier.

* * * * *